United States Patent
Jeon et al.

(10) Patent No.: US 8,169,148 B2
(45) Date of Patent: May 1, 2012

(54) PLASMA GENERATING APPARATUS

(75) Inventors: Sang Jean Jeon, Hwaseong-si (KR); Yuri Tolmachev, Suwon-si (KR); Su Ho Lee, Seongnam-si (KR); Seoung Hyun Seok, Suwon-si (KR); Young Min Park, Suwon-si (KR); Won Hyuk Jang, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 913 days.

(21) Appl. No.: 12/149,450

(22) Filed: May 1, 2008

(65) Prior Publication Data
US 2009/0015165 A1  Jan. 15, 2009

(30) Foreign Application Priority Data
Jul. 10, 2007 (KR) .................. 10-2007-0069061

(51) Int. Cl.
*H01J 7/24* (2006.01)

(52) U.S. Cl. .......... 315/111.21; 315/111.41; 315/111.51

(58) Field of Classification Search .................. 315/108, 315/110, 111.01, 111.21, 111.41, 111.51, 315/111.71, 111.91
See application file for complete search history.

(56) References Cited

U.S. PATENT DOCUMENTS

| | | | | |
|---|---|---|---|---|
| 6,270,687 B1* | 8/2001 | Ye et al. | .......................... | 216/68 |
| 6,465,051 B1* | 10/2002 | Sahin et al. | .................... | 427/534 |
| 2005/0126711 A1* | 6/2005 | Kazumi et al. | ........... | 156/345.48 |
| 2008/0138996 A1* | 6/2008 | Nishizuka | ...................... | 438/726 |
| 2008/0236493 A1* | 10/2008 | Sakao | ........................ | 118/723.1 |

* cited by examiner

*Primary Examiner* — Douglas W Owens
*Assistant Examiner* — Jianzi Chen
(74) *Attorney, Agent, or Firm* — Staas & Halsey LLP

(57) ABSTRACT

A plasma generating apparatus having superior plasma generation efficiency that uses a single reaction chamber. The plasma generating apparatus includes a RF generator for providing a RF power, an antenna for generating an electromagnetic field upon receiving the RF power, a reaction chamber for exciting/ionizing a reaction gas via the electromagnetic field, and generating a plasma, and a plasma channel for absorbing the RF power, and allowing a current signal to be induced to the plasma.

21 Claims, 4 Drawing Sheets

PLASMA GENERATING APPARATUS

CROSS-REFERENCE TO RELATED APPLICATIONS

This application claims the benefit of Korean Patent Application No. 2007-0069061, filed on Jul. 10, 2007 in the Korean Intellectual Property Office, the disclosure of which is incorporated herein by reference.

BACKGROUND

1. Field

The present invention relates to a plasma generating apparatus, and more particularly to a plasma generating apparatus for generating a high-density plasma having superior uniformity.

2. Description of the Related Art

Generally, the plasma is indicative of a highly-ionized gas including positive and negative ions and electrons, and has been widely used for the etching/depositing of the semiconductor fabrication process which forms a fine pattern (e.g., a semiconductor wafer or a glass substrate of the LCD).

Recently, as the integration degree of the semiconductor element gradually increases, a line width of the fine pattern gradually decreases, so that there is needed a plasma generating apparatus capable of generating the high-density plasma to improve the plasma uniformity used for the fine pattern. A variety of plasma generating apparatuses have been widely used, and representative examples are an Inductive Coupled Plasma (ICP) generating apparatus and a Capacitive Coupled Plasma (CCP) generating apparatus. Specifically, in the case of providing the electromagnetic energy for generating the plasma, the ICP generating apparatus has the plasma loss less than that of the CCP generating apparatus, and the sample (e.g., the semiconductor wafer or the glass substrate) of the ICP generating apparatus is not affected by the electromagnetic field, so that the ICP generating apparatus has been used more frequently than the CCP generating apparatus, Examples of the above-mentioned ICP generating apparatus are shown in FIGS. 1 and 2.

FIG. 1 is a cross-sectional view illustrating a conventional plasma generating apparatus. FIG. 2 is a plan view illustrating a conventional plasma generating apparatus. The plasma generating apparatus of FIG. 1 or 2 includes at least one ferrite core 41.

The conventional plasma generating apparatus 100 includes a vacuum-state upper reaction container 111 and a vacuum-state lower reaction container 112 coupled to each other. The upper and lower reaction containers 111 and 112 include the plasma generated by the ionized injection gas.

The space formed by two reaction containers 111 and 112 is divided into two reaction chambers 113 and 114 by the partitions 121 and 122, respectively. The reaction chambers 113 and 114 include chucks 131 and 132, respectively. The sample (e.g., the semiconductor wafer or the glass substrate) is located at the lower chuck 132. Six toroidal-shaped ferrite cores 141 spaced apart from each other at regular intervals are circularly arranged at the center of each of the reaction chambers 113 and 114. The coil 142 is wound on each ferrite core 141. The coil 142's winding direction among the neighboring ferrite cores 141 are opposite to each other, so that the induced electromotive forces generated from the neighboring ferrite cores 141 have opposite phases.

The reaction chambers 113 and 114 are interconnected via a through-hole 152 formed in the tube 151 passing through the center of the ferrite core 141. The reaction gas passes via the through-hole 152, and the through-hole 152 is used as the path of the discharging current signal. In the case of processing the sample, the coil 142 wound on the ferrite core 141 is used as a primary coil, and the plasma is used as a secondary part, so that the high-frequency RF power applied to the primary coil 142 is applied to the plasma acting as the secondary part. The induced electromotive forces of the neighboring ferrite cores 141 has a phase difference of 180°. The path of the current signal induced to the plasma forms a closed path via two neighboring through-holes 152. The arrows of FIG. 2 indicate six induced current signals formed among the neighboring through-holes 152.

The conventional plasma generating apparatus 100 must configure the path of the secondary current signal induced to the plasma in the form of a closed circuit in order to increase the plasma generation efficiency, so that it requires two reaction chambers 113 and 114. Indeed, the conventional plasma generating apparatus 100 has difficulty in using one of the two reaction chambers 113 and 14, resulting in the loss of plasma and the occurrence of particles.

SUMMARY

Therefore, it is an aspect of the invention to provide a plasma generating apparatus which has a superior plasma generation efficiency simultaneously while using a single reaction chamber.

It is another aspect of the invention to provide a plasma generating apparatus for maximizing the inductive coupling using a toroidal-shaped ferrite core and a tube-shaped channel, increasing a plasma generation efficiency, and uniformly distributing the high-density plasma.

Additional aspects and/or advantages of the invention will be set forth in part in the description which follows and, in part, will be apparent from the description, or may be learned by practice of the invention.

In accordance with the invention, the above and/or other aspects can be achieved by the provision of a plasma generating apparatus including: a RF generator for providing a RF power; an antenna for generating an electromagnetic field upon receiving the RF power; a reaction chamber for exciting/ionizing a reaction gas via the electromagnetic field, and generating a plasma; and a plasma channel for absorbing the RF power, and allowing a current signal to be induced to the plasma.

The antenna may include: a high-frequency antenna coil for providing the RF power having a high-frequency band so as to perform ignition of the plasma; and a low-frequency antenna coil for receiving the RF power having a low-frequency band to perform inductive coupling of the plasma.

The apparatus may further include: a window for transmitting the electromagnetic field of the antenna to an inner part of the reaction chamber, wherein the high-frequency antenna coil is arranged on the window.

The high-frequency band of the high-frequency antenna coil may be in the range from 2 MHz to several hundreds of MHz.

The low-frequency band of the low-frequency antenna coil may be in the range from several tens of KHz to 2 MHz.

The low-frequency antenna coil may be wound on each of several ferrite cores arranged in the form of a toroidal shape so as to transmit the electromagnetic field to the plasma.

Each of the ferrite cores arranged in the form of the toroidal shape may include a plasma channel, so that the plasma current signal forms a closed circuit and passes the circuit.

The plasma channels arranged in the ferrite cores may be regularly arranged on a circumference of the reaction chamber.

The plasma channel may be configured in the form of "¬"shape.

The "¬"-shaped plasma channel may be connected to a "L"-shaped wall of the reaction chamber so as to reduce the loss of the plasma.

In accordance with another aspect of the present invention, there is provided a plasma generating apparatus including: a reaction chamber for generating a plasma; a RF generator for providing a RF power to generate the plasma; an antenna system generating an electromagnetic field upon receiving the RF power; and a plasma channel for absorbing the RF power, and allowing a current signal to be induced to the plasma.

The antenna system may include: a high-frequency antenna system for providing the RF power having a high-frequency band so as to perform ignition of the plasma; and a low-frequency antenna system for receiving the RF power having a low-frequency band to perform inductive coupling of the plasma.

The apparatus may further include: a window for transmitting the electromagnetic field of the antenna to an inner part of the reaction chamber, wherein the high-frequency antenna system is arranged on the window.

The high-frequency band of the high-frequency antenna system may be in the range from 2 MHz to several hundreds of MHz.

The low-frequency band of the low-frequency antenna coil may be in the range from several tens of KHz to 2 MHz.

The low-frequency antenna system may arrange several ferrite cores in the form of a toroidal shape so as to transmit the electromagnetic field to the plasma, and each of the ferrite cores arranged in the form of the toroidal shape may include a plasma channel, so that the plasma current signal forms a closed circuit and passes the circuit.

The low-frequency antenna system may further include a DC brake to cut off the current signal induced on the plasma channel.

The apparatus may further include: a controller for controlling uniformity of the plasma by adjusting an input RF power of the high-frequency and low-frequency antenna systems.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
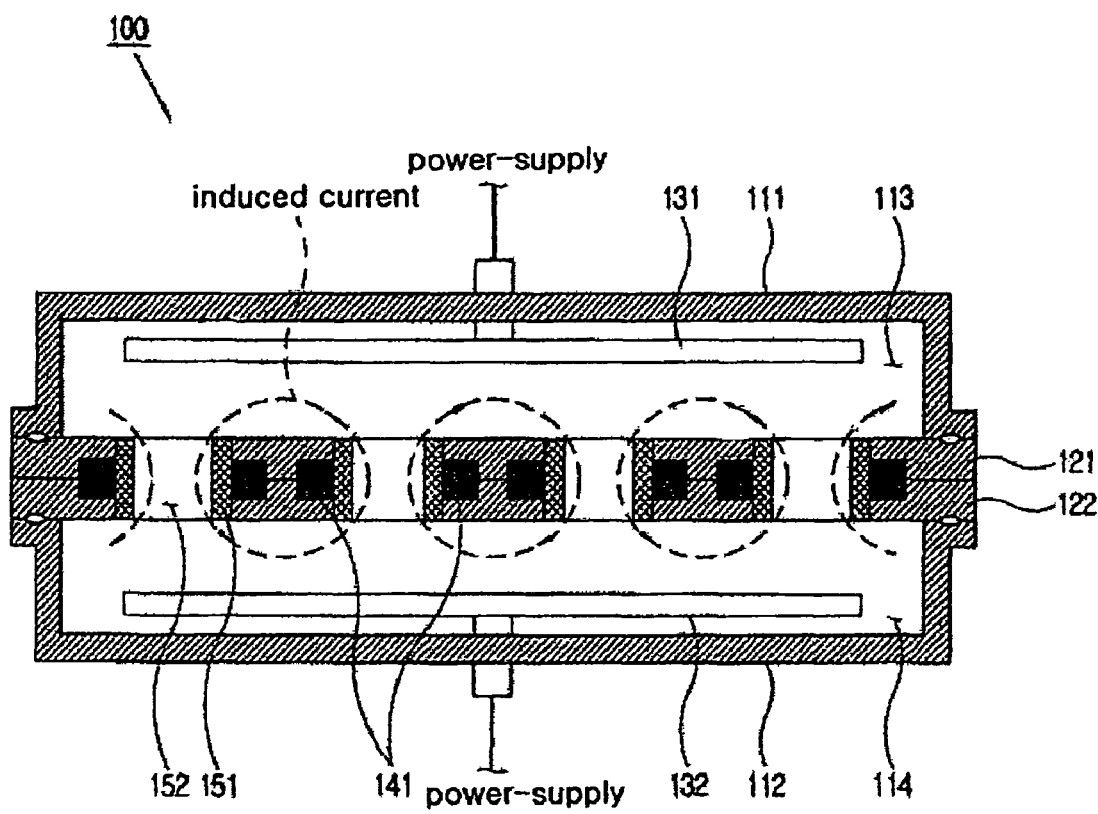
FIG. 1 is a cross-sectional view illustrating a conventional plasma generating apparatus.
Figure 2:
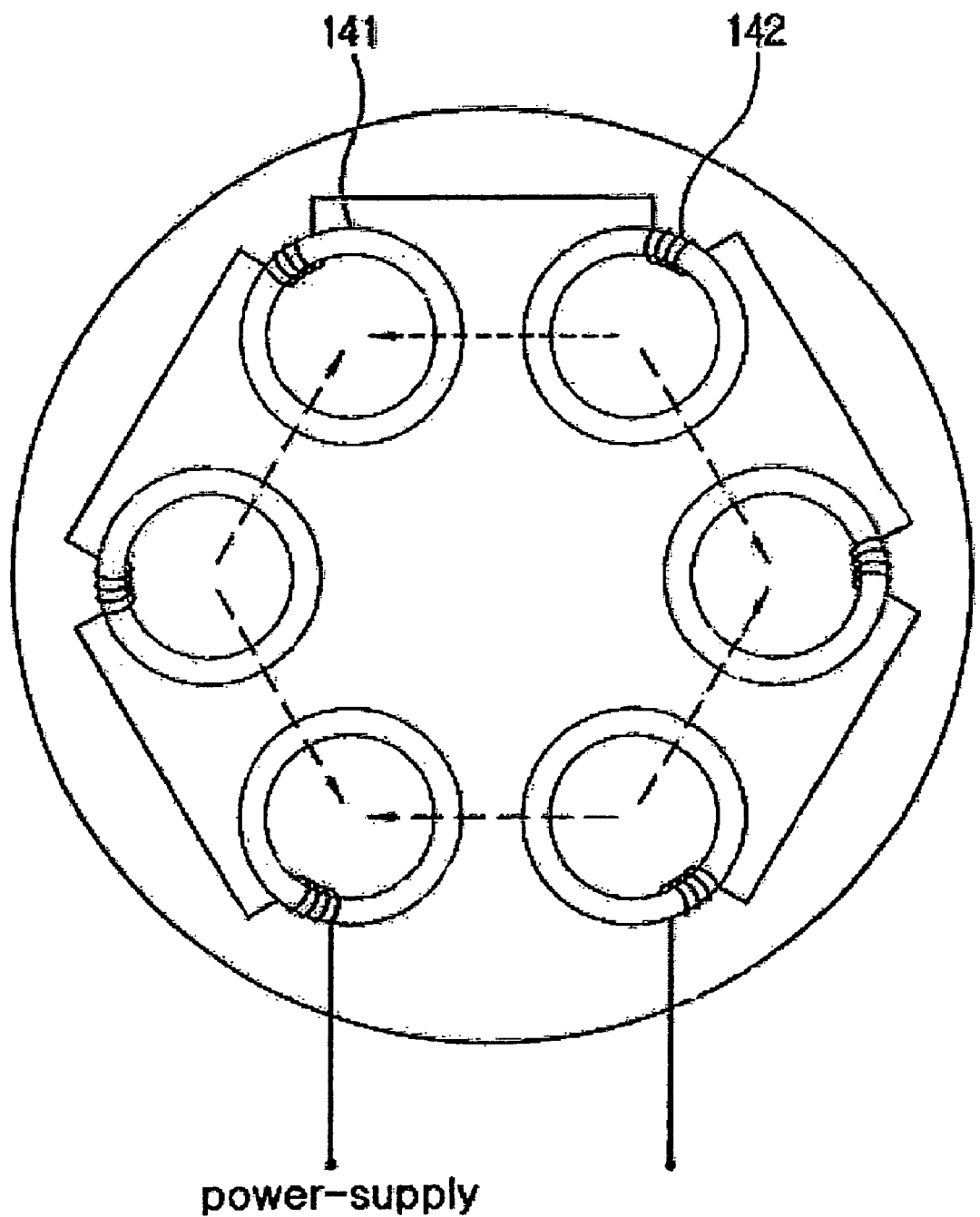
FIG. 2 is a plan view illustrating a conventional plasma generating apparatus.

Reference will now be made in detail to the embodiments of the present invention, examples of which are illustrated in the accompanying drawings, wherein like reference numerals refer to like elements throughout. The embodiments are described below to explain the present invention by referring to the figures.

Recently, as the size of a semiconductor wafer or a glass substrate is rapidly increasing to improve the productivity of semiconductor fabrication based on the plasma, the necessity of the plasma generating apparatus for generating high-density plasma having superior uniformity is also rapidly increasing.

The high-density plasma generating apparatus includes an antenna system. The antenna system includes a low-frequency RF power to generate the plasma, and a high-frequency RF power for providing the high-frequency RF power to draw the ions or radicals of the plasma toward the semiconductor wafer or glass substrate. In this case, the low-frequency RF power is called a source power, and the high-frequency RF power is called a bias power.

In the case of using the source power (about 2 MHz~several hundreds of MHz) of the antenna system, the size of the plasma generating apparatus gradually increases, so that the plasma uniformity becomes deteriorated due to the transmission line effect. Therefore, in the case of using a low-frequency RF power (about several tens of KHz~2 MHz) of the antenna system, the line transmission effect can be removed, so that the above-mentioned antenna system can be highly compatible with a large-area high-density plasma generating apparatus.

However, induced electromotive force (E) generated from the antenna for the plasma generation is proportional to the magnetic field (B) of the antenna and the frequency (ω) of the power-supply voltage. So, in the case of using the power-supply voltage, the plasma generation efficiency becomes deteriorated.

Individual steps have different pressure conditions in their reaction chambers, because different reaction gases are received in the reaction chambers according to the individual steps. If the RF power having a relatively low-frequency RF power is used, it is difficult to stably generate the plasma in the plasma ignition step, so that the plasma generating apparatus has difficulty in plasma ignition.

Therefore, the present invention includes the low-frequency antenna system and the high-frequency antenna system, so that it can effectively perform the plasma ignition using the high-frequency antenna system which uses the high-frequency power-supply voltage advantages to the plasma ignition under various pressure conditions, and at the same time increases the inductive coupling efficiency between the low-frequency antenna and the plasma using the low-frequency antenna system composed of both a multi-ferrite core having a high transmission rate and a plasma channel, resulting in the increase of plasma generation efficiency.

Figure 3:
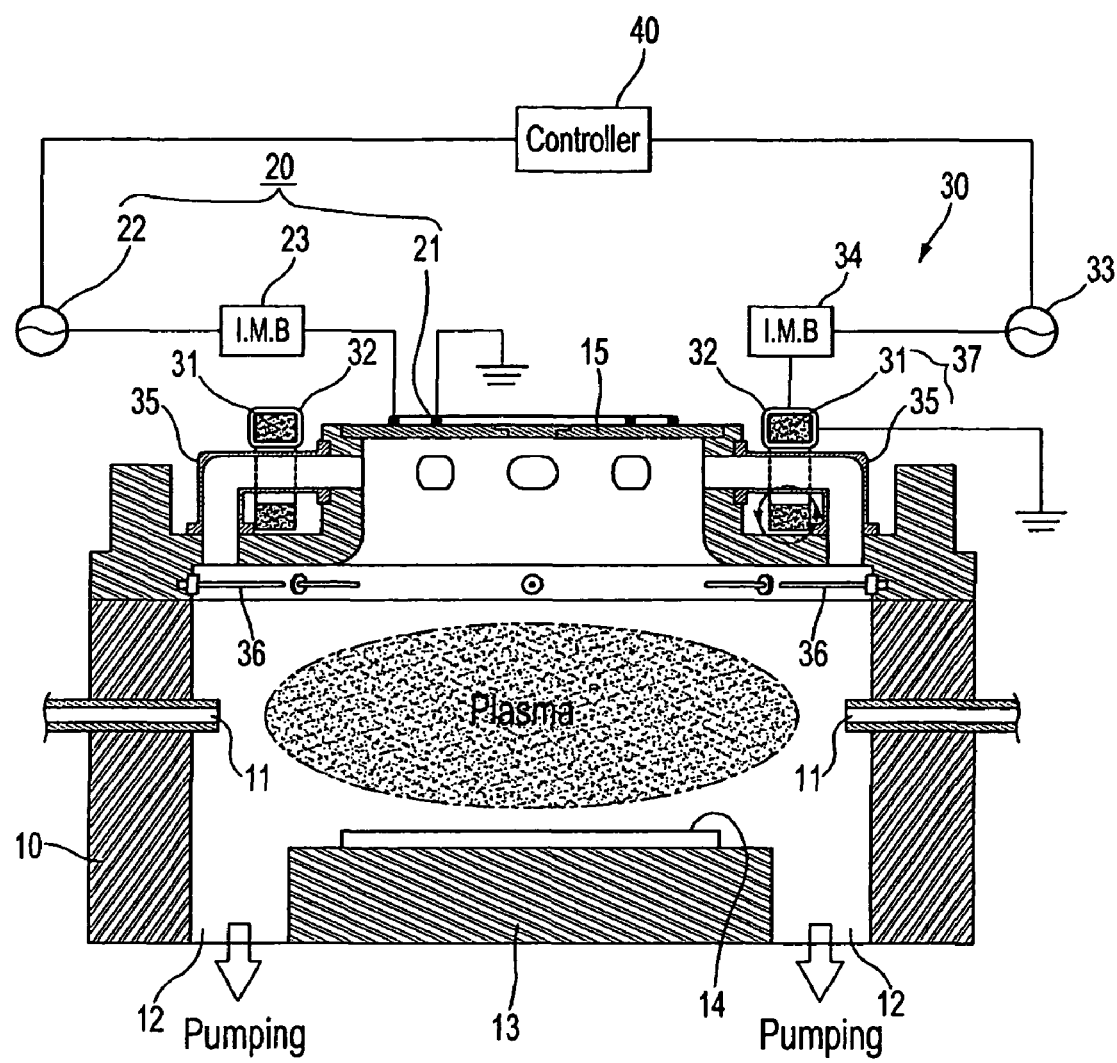
FIG. 3 is a cross-sectional view illustrating a plasma generating apparatus according to one embodiment of the present invention.
Figure 4:
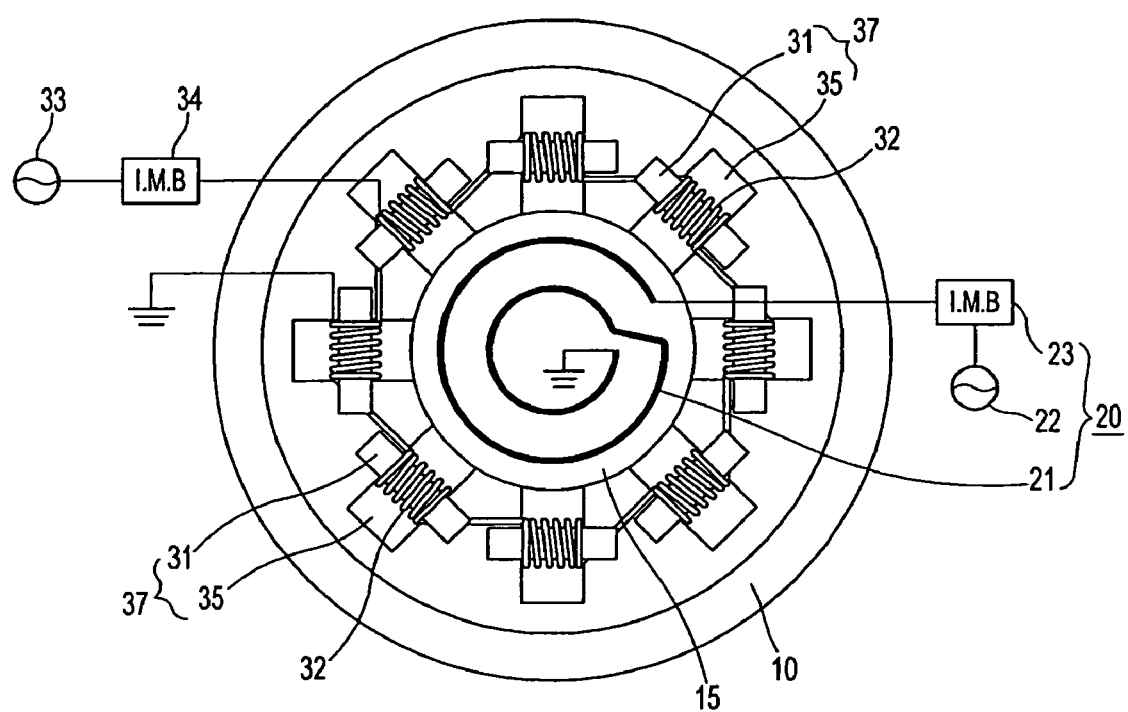
FIG. 4 is a plan view illustrating a plasma generating apparatus according to one embodiment of the present invention.

FIG. 3 is a cross-sectional view illustrating a plasma generating apparatus according to one embodiment of the present invention. FIG. 4 is a plan view illustrating a plasma generating apparatus according to one embodiment of the present invention.

In FIG. 3, the plasma generating apparatus according to the present invention includes a vacuum-state reaction chamber 10, a high-frequency antenna system 20, a low-frequency antenna system 30, and a controller 40.

The reaction chamber 10 includes the plasma generated by the ionized injection gas. The high-frequency antenna system 20 is arranged at the center of an upper part of the reaction chamber 10. The low-frequency antenna system 30 is arranged at the outside of the upper part of the reaction chamber 10. The controller 40 adjusts the input RF power of the high-frequency and low-frequency antenna systems 20 and 30 so as to control the plasma uniformity.

The reaction chamber 10 forms a process area in which the semiconductor fabrication process based on the plasma is conducted, and maintains the process area in a vacuum state at a predetermined temperature. The reaction chamber 10 includes a pair of gas nozzles 11 for injecting the reaction gas from the external part, and a gas outlet 12 for discharging the reaction gas to the outside after the reaction has been completed. The reaction chamber 10 includes a trimmer chuck 13 on which the sample 14 (e.g., the semiconductor wafer or the glass substrate) is seated.

The dielectric window 15 is arranged among the reaction chamber 10 and the high-frequency and low-frequency antenna systems 20 and 30, so that it transmits the electromagnetic field of the high-frequency and low-frequency antenna systems 20 and 30 to the inside of the reaction chamber 10. The window 15 is made of a dielectric material such as alumina or quartz.

The high-frequency antenna system 20 includes a high-frequency antenna coil 21, a high-frequency RF generator 22, and an impedance matching unit 23. The high-frequency RF generator 22 provides the high-frequency antenna coil 21 with the RF power having the high-frequency band (2 MHz~several hundreds of MHz).

The impedance matching unit 23 transmits the RF power of the high-frequency RF generator 22 to the high-frequency antenna coil 21 without any loss. The high-frequency antenna coil 21 may be composed of a serial antenna configured in the form of a spiral shape or a serial/parallel antenna.

The low-frequency antenna system 30 includes a ferrite core 31, a low-frequency antenna coil 32, a low-frequency RF generator 33, and an impedance matching unit 34. The low-frequency antenna coil 32 is wound on the ferrite core 31. The low-frequency RF generator 33 provides the low-frequency antenna coil with the RF power having a low-frequency band (several tens of KHz~2 MHz). The impedance matching unit 34 transmits the RF power of the low-frequency RF generator 33 to the low-frequency antenna coil 32 without any loss. The ferrite core 31 is composed of a toroidal-shaped multi-ferrite core 31 for effectively applying the electromagnetic field created by a primary current signal of the low-frequency antenna coil 32 to a secondary plasma.

The low-frequency antenna system 30 includes the plasma channel 35 contained in each ferrite core 33. The plasma channel 35 configures the path of a high-frequency current induced to the secondary plasma in the form of a closed circuit, so that it absorbs the RF power supplied from the low-frequency RF generator 33. The plasma channel 35 is formed of a metal tube or a ceramic tube. If the plasma channel 35 is formed of a metal tube, a DC brake 36 is used. This DC brake 36 prevents the plasma current signal from being induced, so that it can effectively apply the RF power to the plasma.

The path of the high-frequency current signal induced to the secondary plasma may correspond to the plasma channel 35 and the reaction chamber 10. In order to reduce the plasma loss of the plasma channel 35's area, the "└"-shaped wall of the reaction chamber 10 is connected to the "¬"-shaped plasma channel 35, so that the size of the plasma channel 35 is minimized.

Each ferrite core 31 and the plasma channel 35 configure the plasma source module 37, so that at least two plasma source modules 37 are regularly arranged on a circumference of the reaction chamber 10.

The controller 40 controls the RF power ratio of the high-frequency and low-frequency RF generators 22 and 33 to adjust the RF power applied to the high-frequency and low-frequency antenna systems 20 and 30.

Operations and effects of the above-mentioned plasma generating apparatus will hereinafter be described.

Initially, the plasma generating apparatus discharges the gas to the outside using the vacuum pump (not shown), and receives the reaction gas to generate the plasma via the gas nozzle 11, so that it maintains the necessary pressure.

Then, if the RF power having the high-frequency band (2 MHz~several hundreds of MHz) is applied from the high-frequency RF generator 22 to the high-frequency antenna coil 21 of the high-frequency antenna system 20 so as to perform the plasma ignition, the current signal flowing in the high-frequency antenna coil 21 forms the sine-wave electromagnetic field, so that an induced electric field is formed in the process area of the reaction chamber 10. The induced electric field accelerates particles of the reaction gas contained in the reaction chamber 10, excites/ionizes the reaction gas, so that the plasma ignition is conducted and the plasma occurs in the center of the reaction chamber 10. In this case, during the plasma generation, the plasma generating apparatus applies the low-frequency RF power to the low-frequency antenna system after igniting the plasma using the high-frequency antenna system 20.

If the RF power having the low-frequency band (several tens of KHz~2 MHz) is applied from the low-frequency RF generator 33 to the low-frequency antenna coil 32 of the low-frequency antenna system 30, the current signal flowing in the low-frequency antenna coil 32 forms the sine-wave electromagnetic field, and an induced electric field opposite to the current signal of the low-frequency antenna coil 32 is formed in the process area of the reaction chamber 10. The induced electric field accelerates particles of the reaction gas contained in the reaction chamber 10, excites/ionizes the reaction gas, so that the plasma is generated outside of the reaction chamber 10. The sample 14 seated on the chuck 13 contained in the reaction chamber 10 is deposited on a thin film by the plasma or is etched by the plasma.

In this case, the primary current signal flowing in each low-frequency antenna coil 32 and the current signal induced to the secondary plasma are opposite to each other, so that the plasma generating apparatus prevents the electromagnetic field from being lost, increases the electromagnetic field of the process area, so that it increases the plasma generation efficiency although the low-frequency RF power is used.

Therefore, in the case of using the above-mentioned low-frequency antenna system 30, the plasma generating apparatus can remove the transmission line effect using the RF power having a relatively low-frequency band (several tens of KHz~2 MHz), so that it can uniformly generate the high-density plasma. The plasma generating apparatus uses the toroidal-shaped multi-ferrite core 31 having a high transmission rate, so that it increases the inductive coupling efficiency between the low-frequency antenna system 30 and the plasma. So, the plasma generating apparatus can increase the plasma generation efficiency using the RF power having a relatively low-frequency.

The low-frequency antenna system 30 is formed of a toroidal-shaped multi-ferrite core 31 in order to effectively transmit the electromagnetic field created by the primary current of the low-frequency antenna coil 32 to the secondary plasma. As shown in the dotted circle of FIG. 3, the secondary plasma allows the path of the plasma current signal to form a closed circuit, and absorbs the RF power generated from the low-frequency RF generator 33 using the closed circuit, so that the plasma density increases by two or more times as compared to the conventional art. In this case, the plasma channel 35 is formed of a metal tube or a ceramic tube. If the plasma channel 35 is formed of the metal tube, the DC brake 36 is required for the plasma generating apparatus, so that the DC brake 36 prevents the current signal from being induced on the plasma channel 35, and the RF power can be effectively applied to the plasma.

The path of the high-frequency current signal induced to the secondary plasma may correspond to the plasma channel 35 and the reaction chamber 10. In order to reduce the plasma loss of the plasma channel 35's area, the "∟"-shaped wall of the reaction chamber 10 is connected to the "¬"-shaped plasma channel 35, so that the size of the plasma channel 35 is minimized.

However, as described above, different reaction gases are injected into the reaction chamber 10 according to individual steps, and the individual steps have a variety of pressure conditions in the reaction chamber 10, so that the low-frequency antenna system 30 employing the relatively low-frequency RF power has difficulty in the initial plasma ignition. In order to solve this problem, the high-frequency antenna system 20 can easily ignite the plasma under a variety of pressure conditions. The electrostatic field caused by the high voltage of the high-frequency antenna coil 21 accelerates the seed electrons, so that it induces the initial discharging.

Therefore, the plasma generating apparatus always ignites the plasma using the high-frequency antenna coil 21 during the plasma generation, and then applies the RF power to the low-frequency antenna system 30. In this case, the controller 40 adjusts the input RF power of the high-frequency and low-frequency antenna systems 20 and 30, so that it controls the plasma uniformity.

Therefore, the plasma generating apparatus has no unnecessary reaction chamber 10, generates the large-area/high-density plasma, so that it can be highly compatible with a variety of commercial devices. Specifically, the plasma generating apparatus is applied to the HCPCVD or the etcher device, so that it reduces the process time below a critical dimension (CD) of 100, and can also be easily applied to the plasma processing device of the flat panel display (FPD) such as a LCD.

As is apparent from the above description, the plasma generating apparatus has no unnecessary reaction chamber because it uses only one reaction chamber, and has a superior plasma generation efficiency, so that it can be highly compatible with all the processing devices based on the plasma.

The plasma generating apparatus maximizes the inductive coupling using a toroidal-shaped ferrite core and a tube-shaped channel, increases a plasma generation efficiency, and uniformly distributes the high-density plasma.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A plasma generating apparatus comprising:
   a RF generator for providing a RF power;
   an antenna unit for generating an electromagnetic field upon receiving the RF power;
   a single reaction chamber for exciting/ionizing a reaction gas via the electromagnetic field, and generating a plasma; and
   a plasma channel formed of a metal tube or a ceramic tube for absorbing the RF power,
   and allowing a current signal to be induced to the plasma, wherein the plasma channel is part of the antenna unit.

2. The apparatus according to claim 1, wherein the antenna unit comprises:
   a high-frequency antenna coil for receiving the RF power having a high-frequency band to perform ignition of the plasma; and
   a low-frequency antenna coil for receiving the RF power having a low-frequency band to perform inductive coupling of the plasma.

3. The apparatus according to claim 2, further comprising:
   a window for transmitting the electromagnetic field of the antenna unit to an inner part of the reaction chamber,
   wherein the high-frequency antenna coil is arranged on the window.

4. The apparatus according to claim 2, wherein the high-frequency band of the high-frequency antenna coil is in the range from 2 MHz to several hundreds of MHz.

5. The apparatus according to claim 2, wherein the low-frequency band of the low-frequency antenna coil is in the range from several tens of KHz to 2 MHz.

6. The apparatus according to claim 2, wherein the low-frequency antenna coil is wound on each of several ferrite cores arranged in the form of a toroidal shape so as to transmit the electromagnetic field to the plasma.

7. The apparatus according to claim 6, wherein each of the ferrite cores arranged in the form of the toroidal shape includes a plasma channel, so that the plasma current signal forms a closed circuit and passes the circuit.

8. The apparatus according to claim 7, wherein the plasma channels arranged in the ferrite cores are regularly arranged on a circumference of the reaction chamber.

9. The apparatus according to claim 8, wherein the plasma channel is configured in the form of ""¬"" shape.

10. The apparatus according to claim 9, wherein the "¬"-shaped plasma channel is connected to a ""∟""-shaped wall of the reaction chamber so as to reduce the loss of the plasma.

11. A plasma generating apparatus comprising:
    a single reaction chamber for generating a plasma;
    a RF generator for providing a RF power to generate the plasma;
    an antenna system generating an electromagnetic field upon receiving the RF power; and
    a plasma channel formed of a metal tube or a ceramic tube for absorbing the RF power,
    and allowing a current signal to be induced to the plasma, wherein the plasma channel is part of the antenna system.

12. The apparatus according to claim 11, wherein the antenna system comprises:
    a high-frequency antenna system for providing the RF power having a high-frequency band to perform ignition of the plasma; and
    a low-frequency antenna system for providing the RF power having a low-frequency band to perform inductive coupling of the plasma.

13. The apparatus according to claim 12, further comprising:
    a window for transmitting the electromagnetic field of the antenna to an inner part of the reaction chamber,
    wherein the high-frequency antenna system is arranged on the window.

14. The apparatus according to claim 12, wherein the high-frequency band of the high-frequency antenna system is in the range from 2 MHz to several hundreds of MHz.

15. The apparatus according to claim 12, wherein the low-frequency band of the low-frequency antenna system is in the range from several tens of KHz to 2 MHz.

16. The apparatus according to claim 12, wherein the low-frequency antenna system arranges several ferrite cores in the form of a toroidal shape so as to transmit the electromagnetic field to the plasma, and
each of the ferrite cores arranged in the form of the toroidal shape includes a plasma channel, so that the plasma current signal forms a closed circuit and passes the circuit.

17. The apparatus according to claim 16, wherein the plasma channel is configured in the form of "⌐¬" shape.

18. The apparatus according to claim 17, wherein the "⌐¬"-shaped plasma channel is connected to a "⌐L¬"-shaped wall of the reaction chamber so as to reduce the loss of the plasma.

19. The apparatus according to claim 12, wherein the low-frequency antenna system further includes a DC brake to cut off the current signal induced on the plasma channel.

20. The apparatus according to claim 12, further comprising:
a controller for controlling uniformity of the plasma by adjusting an input RF power of the high-frequency and low-frequency antenna systems.

21. The apparatus according to claim 12, wherein the high-frequency antenna system includes a high-frequency antenna coil composed of a serial antenna configured in the form of a spiral shape or a serial/parallel antenna.

* * * * *

UNITED STATES PATENT AND TRADEMARK OFFICE
CERTIFICATE OF CORRECTION

PATENT NO. : 8,169,148 B2  Page 1 of 1
APPLICATION NO. : 12/149450
DATED : May 1, 2012
INVENTOR(S) : Sang Jean Jeon et al.

It is certified that error appears in the above-identified patent and that said Letters Patent is hereby corrected as shown below:

Column 8, Line 33, In Claim 9, delete " "ㄱ" " and insert -- "ㄱ" --, therefor.

Column 8, Line 34-35, In Claim 10, delete " "ㄱ" " and insert -- "ㄱ" --, therefor.

Column 8, Line 35, In Claim 10, delete " "ㄴ" " and insert -- "ㄴ" --, therefor.

Column 9, Line 10, In Claim 17, delete " "ㄱ" " and insert -- "ㄱ" --, therefor.

Column 9, Line 11-12, In Claim 18, delete " "ㄱ" " and insert -- "ㄱ" --, therefor.

Column 9, Line 12, In Claim 18, delete " "ㄴ" " and insert -- "ㄴ" --, therefor.

Signed and Sealed this
Nineteenth Day of March, 2013

Teresa Stanek Rea
*Acting Director of the United States Patent and Trademark Office*